United States Patent
Kim et al.

(10) Patent No.: US 9,397,644 B2
(45) Date of Patent: Jul. 19, 2016

(54) FREQUENCY DOUBLER

(71) Applicant: Samsung Electronics Co., Ltd., Suwon-si (KR)

(72) Inventors: Woo-Seok Kim, Suwon-si (KR); Tae-Ik Kim, Seongnam-si (KR); Ji-Hyun Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/571,944

(22) Filed: Dec. 16, 2014

(65) Prior Publication Data

US 2016/0049927 A1 Feb. 18, 2016

(30) Foreign Application Priority Data

Aug. 14, 2014 (KR) .................. 10-2014-0106070

(51) Int. Cl.
*H03B 19/00* (2006.01)
*H03K 5/00* (2006.01)
*H03K 19/21* (2006.01)

(52) U.S. Cl.
CPC .......... *H03K 5/00006* (2013.01); *H03K 19/215* (2013.01)

(58) Field of Classification Search
CPC ........ H03B 19/14; H03B 19/10; H03B 19/00; H03B 19/16; H03K 5/00006
USPC ................................. 327/114, 116, 119–122
See application file for complete search history.

(56) References Cited

U.S. PATENT DOCUMENTS

| | | | |
|---|---|---|---|
| 5,304,938 A | 4/1994 | Gregory et al. | |
| 5,614,841 A | 3/1997 | Marbot et al. | |
| 5,821,785 A | 10/1998 | Glass et al. | |
| 5,864,246 A | 1/1999 | Anderson | |
| 6,008,700 A | 12/1999 | Pietrzyk | |
| 6,037,812 A | 3/2000 | Gaudet | |
| 6,137,309 A | 10/2000 | Couteaux et al. | |
| 6,917,224 B2 | 7/2005 | Han | |
| 7,236,058 B2 | 6/2007 | Wetzel et al. | |
| 7,696,797 B1 * | 4/2010 | Schnaitter | H03K 3/0322 327/116 |
| 2010/0045389 A1 | 2/2010 | Hu et al. | |

FOREIGN PATENT DOCUMENTS

| | | |
|---|---|---|
| JP | 0879061 | 3/1996 |
| JP | 2004281001 | 10/2004 |
| KR | 2006077112 | 7/2006 |

OTHER PUBLICATIONS

Lee and Razavi, A 40-GB/S Clock and Data Recovery Circuit in 0.18-UM CMOS Technology, IEEE Journal of Solid-State Circuits, vol. 38, No. 12, Dec. 2003, pp. 2181-2191.

* cited by examiner

*Primary Examiner* — Lincoln Donovan
*Assistant Examiner* — Diana J Cheng
(74) *Attorney, Agent, or Firm* — Onello & Mello LLP

(57) ABSTRACT

A frequency doubler includes a voltage controlled oscillator outputting N (where, N is a natural number) signals having a first period and having different phases, and an XOR circuit receiving the N signals and outputting a signal having a second period that corresponds to a half of the first period, wherein the voltage controlled oscillator includes N nodes that correspond to the N signals and inverter units respectively connecting the N nodes, the N nodes are arranged so that, if a signal that starts from any one start node of the N nodes passes through the same number of the inverter units, it recurs to the corresponding start node, the XOR gate includes a first unit block set including N unit blocks that are connected to the same output node and match the N nodes in a one-to-one manner, and a second unit block set that is substantially the same as the first unit block set, wherein the first and second unit block sets share the output node.

19 Claims, 18 Drawing Sheets

1200

FREQUENCY DOUBLER

CROSS-REFERENCE TO RELATED APPLICATIONS

This application is based on and claims priority from Korean Patent Application No. 10-2014-0106070, filed on Aug. 14, 2014 in the Korean Intellectual Property Office, the disclosure of which is incorporated herein in its entirety by reference.

BACKGROUND

1. Field

The present inventive concepts relate to a frequency doubler, and more particularly a frequency doubler having a voltage controlled oscillator and an XOR gate.

2. Description of the Related Art

A phase locked loop (PLL) is typically used in various kinds of electronic circuits. In particular, the phase locked loop is important to a communication circuit. In a wireless communication system, a wireless device (e.g., a cellular phone) generally uses a clock signal in the case of a digital circuit, and uses an LO signal in the case of a transmitter and receiver circuit. The clock signal and the LO signal are generated by using a voltage-controlled oscillator (VCO) that mainly operates in the PLL.

The phase locked loop generally includes a phase frequency detector, a charge pump, a loop filter, a VCO, and an XOR gate. In general, the phase frequency detector, the charge pump, and the loop filter detect a phase error between a reference signal and a clock signal, which are obtained from the VCO, and generates a control signal Vctrl for the VCO. The control signal controls the frequency of the VCO so that the clock signal is synchronized with the reference signal. The XOR gate may receive a multi-phase signal to double the frequency of the VCO.

SUMMARY

In one aspect, embodiments of the present inventive concepts provide a frequency doubler which has a low deterministic jitter regardless of a change of a process.

In another aspect, embodiments of the present inventive concepts provide an XOR gate which is included in a frequency doubler which has a low deterministic jitter regardless of a change of a process.

Additional advantages, subjects, and features of the inventive concepts will be set forth in part in the description which follows and in part will become apparent to those having ordinary skill in the art upon examination of the following or may be learned from practice of the inventive concepts.

According to an aspect of the present inventive concepts, there is provided a frequency doubler including a voltage controlled oscillator configured to output N signals having a first period and having different phases, N being a natural number, and an XOR circuit configured to receive the N signals and output a signal having a second period that corresponds to a half of the first period, wherein the voltage controlled oscillator includes N nodes that correspond to the N signals and inverter units respectively connecting the N nodes, the N nodes are arranged so that, if a signal that starts from any one start node of the N nodes passes through the same number of the inverter units, it recurs to the corresponding start node, the XOR gate includes a first unit block set including N unit blocks that are connected to the same output node and match the N nodes in a one-to-one manner, and a second unit block set that is substantially the same as the first unit block set, wherein the first and second unit block sets share the output node.

According to another aspect of the present inventive concepts, there is provided an XOR gate including a first input inverter including a first PMOS transistor and a first NMOS transistor, a second input inverter including the first PMOS transistor and a second NMOS transistor that is different from the first NMOS transistor, a third input inverter including a second PMOS transistor and a third NMOS transistor, and a fourth input inverter including the second PMOS transistor and a fourth NMOS transistor that is different from the third NMOS transistor, a first output inverter connected to a drain of the first PMOS transistor and including a third PMOS transistor and a fifth NMOS transistor, and a second output inverter connected to a drain of the second PMOS transistor and including the third PMOS transistor and a sixth NMOS transistor that is different from the fifth NMOS transistor, wherein outputs of the first and second input inverters are connected to an input of the first output inverter, and outputs of the third and fourth input inverters are connected to an input of the second output inverter.

According to still another aspect of the present inventive concepts, there is provided A frequency doubler including a voltage controlled oscillator configured to output first to fourth signals having a first period and having different phases, the first to fourth signals being corresponding to first to fourth nodes, and an XOR circuit configured to receive the first to fourth signals and output a signal having a second period that corresponds to a half of the first period, wherein the voltage controlled oscillator includes a first stage including a first inverter unit configured to invert a signal of the first node and output the inverted signal to the second node, a second inverter unit configured to invert a signal of the third node that is different from the first node and output the inverted signal to the fourth node that is different from the second node, and a third inverter unit configured to invert a signal of the second node to output the inverted signal to the fourth node, or invert a signal of the fourth node to output the inverted signal to the second node, and a second stage including a fourth inverter unit configured to invert the signal of the second node and output the inverted signal to the third node, a fifth inverter unit configured to invert the signal of the fourth node and output the inverted signal to the first node, and a sixth inverter unit configured to invert the signal of the third node to output the inverted signal to the first node, or invert the signal of the first node to output the inverted signal to the third node, and the XOR circuit includes a first unit block set including first to fourth unit blocks that are connected to a first output node and correspond to the first to fourth nodes, respectively, and a second unit block set including fifth to eighth unit blocks that are connected to a second output node and correspond to the first to fourth nodes, respectively, wherein the first unit block set and the second unit block set have substantially the same circuit configurations.

BRIEF DESCRIPTION OF THE DRAWINGS

The above and other objects, features and advantages of the present inventive concepts will be more apparent from the following detailed description taken in conjunction with the accompanying drawings, in which.

DETAILED DESCRIPTION OF EXEMPLARY EMBODIMENTS

Figure 1:
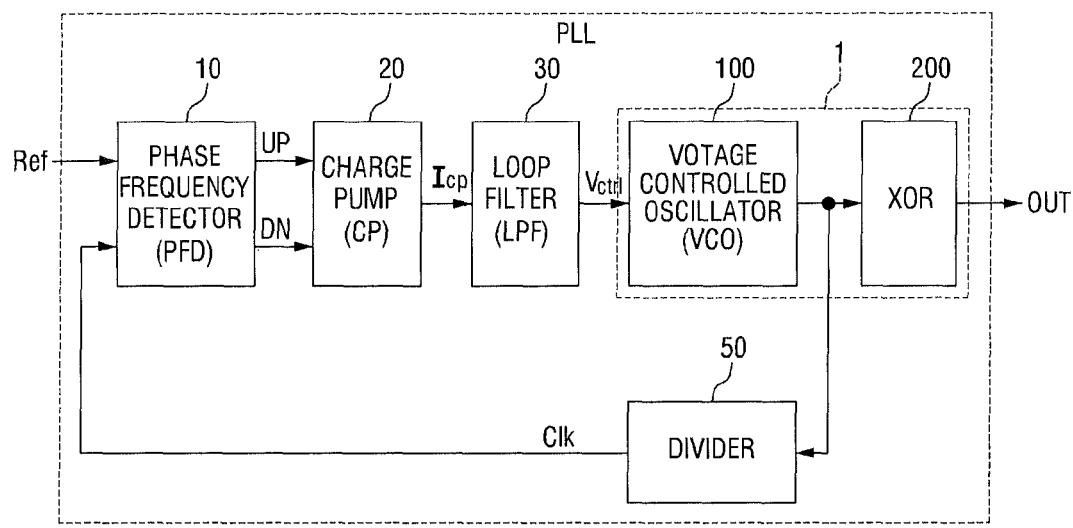
FIG. 1 is a block diagram illustrating a phase locked loop according to exemplary embodiments of the present inventive concepts.

Advantages and features of the present inventive concepts and methods of accomplishing the same may be understood more readily by reference to the following detailed description of preferred embodiments and the accompanying drawings. The present inventive concepts may, however, be embodied in many different forms and should not be construed as being limited to the exemplary embodiments set forth herein. Rather, these embodiments are provided so that this disclosure will be thorough and complete and will fully convey the concept of the inventive concepts to those skilled in the art, and the present inventive concepts will only be defined by the appended claims. Like reference numerals refer to like elements throughout the specification.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the present inventive concepts belong. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, referring to FIGS. 1 to 18, a semiconductor device according to exemplary embodiments of the present inventive concepts and a phase locked loop including the same will be described.

FIG. 1 is a block diagram illustrating a phase locked loop according to exemplary embodiments of the present inventive concepts.

Referring to FIG. 1, according to exemplary embodiments of the present inventive concepts, a phase locked loop may include a phase frequency detector (PFD) 10, a charge pump (CP) 20, a loop filter (LF) 30, a voltage controlled oscillator (VCO) 100, a divider 50, and an XOR gate 200.

The phase frequency detector 10 may receive a reference signal Ref from a reference oscillator (not shown in FIG. 1), and may receive a clock signal Clk from the divider 50. The phase frequency detector 10 compares phases of the received reference signal Ref with the clock signal Clk, and provides an up signal UP and a down signal DN that indicate a phase error or a phase difference between the reference signal Ref and the clock signal Clk.

The clock signal Clk may be called a divided clock signal or a feedback signal. Further, the up signal UP and the down signal DN may be called an early signal and a late signal, or a forward signal and a delay signal. More specifically, the phase frequency detector 10 of the phase locked loop generates a pair of signals that are generally called the up signal UP and the down signal DN. The pair of signals may be generally in a turn-on state for a longer time than the turn-on time of the reference signal Ref in each clock cycle depending on whether the clock signal Clk is leading or lagging in comparison to the reference signal Ref.

The charge pump 20 receives the up signal UP and the down signal DN, and generates an output signal Icp, and the output signal Icp is a current signal that indicates the detected phase error.

The loop filter 30 may generate a control signal Vctrl for the VCO 100 by filtering the output signal Icp from the charge pump 20. The loop filter 30 may control the control signal Vctrl so that the phase or frequency of the clock signal Clk is synchronized with the phase or frequency of the reference signal Ref. The loop filter 30 may have a selected frequency response to achieve a preferable closed-loop response with respect to the PLL 110. For example, the frequency response of the loop filter 30 may be selected on the basis of a gain and a tradeoff between a tracking performance and a PLL noise performance. However, the present inventive concepts are not limited thereto. The loop filter 30 may include a low pass filter LPF.

The voltage controlled oscillator 100 may generate an oscillator signal having a frequency that is determined by the control signal Vctrl generated from the loop filter 30. The voltage controlled oscillator 100 may output N (where, N is a natural number) signals having different phases.

The XOR gate 200 may receive the oscillator signal that is output from the voltage controlled oscillator 100, and may output a signal having a frequency that is double the frequency of the oscillator signal.

The divider 50 supplies the clock signal Clk, which is obtained by dividing the frequency of the oscillator signal output from the voltage controlled oscillator 100 by an integer factor N or N+1, to the phase frequency detector 10. In general, N may be a certain positive integer value.

The phase locked loop according to exemplary embodiments of the present inventive concepts may be used in various kinds of circuits, such as an integer-N PLL, a fraction-N PLL, a multi-modulus device (MMD), and a sigma-delta frequency synthesizer. The integer-N PLL divides the frequency of the oscillator signal from the voltage controlled oscillator by an integer divider ratio N, and in this case, N is N>1. The fraction-N PLL divides the frequency of the oscillator signal by a divider ratio R that is not an integer, for example, by N in a certain case, or by N+1 in another case, and in this case, N is N<R<N+1. The sigma-delta frequency synthesizer may use a sigma-delta modulator (not illustrated) in order to generate the divider ratio R that is not an integer.

Figure 2:
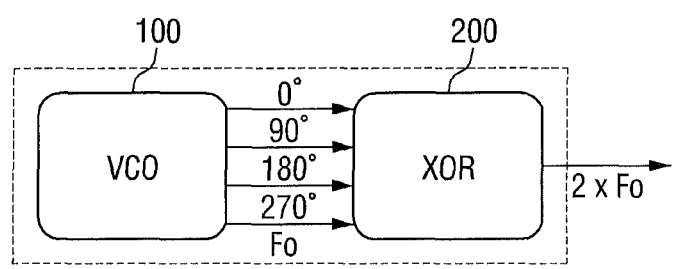
FIG. 2 is a block diagram illustrating a frequency doubler according to an exemplary embodiment of the present inventive concepts.

FIG. 2 is a block diagram of a frequency doubler according to an exemplary embodiment of the present inventive concepts.

Referring to FIG. 2, a frequency doubler 1 according to an exemplary embodiment of the present inventive concepts may include a voltage controlled oscillator 100 and an XOR gate 200.

The voltage controlled oscillator 100 may generate a signal having an output frequency Fo that corresponds to the input voltage Vctrl. The voltage controlled oscillator 100 may output N (where, N is a natural number) signals which have a first period and different phases. For example, the voltage controlled oscillator 100 may output first to fourth signals having different phases. However, the present inventive concepts are not limited thereto.

There may be a phase difference of 1/N period between the N-th signal and the (N−1)-th signal output from the voltage controlled oscillator 100. For example, in the case of the voltage controlled oscillator 100 that outputs the first to fourth signals, there may be a phase difference of 90° between the first signal and the second signal. That is, the first signal may have a phase of 0°, and the second signal may have a phase of 90°. Further, the third signal may have a phase of 180°, and the fourth signal may have a phase of 270°. In this case, the third signal corresponds to an inverted signal of the first signal, and the fourth signal corresponds to an inverted signal of the second signal. However, the present inventive concepts are not limited thereto.

Although not illustrated, the voltage controlled oscillator 100 may include a ring VCO (not illustrated). An output frequency of the ring VCO (not illustrated) may be determined by time delays of respective delay cells and the number of stages. Accordingly, in order to design a high-speed voltage controlled oscillator, it is required to reduce the number of stages and a unit time delay. Once a semiconductor process is determined, the maximum frequency may be limited by the minimum time delay of a delay element. In order to generate an output frequency that is equal to or higher than the frequency that is limited to the minimum time delay, there may be a multiplying method using a ring VCO that outputs a multi-phase signal.

The XOR gate 200 may receive N signals that are output from the voltage controlled oscillator 100 and may output a signal having a second period that corresponds to a half of the first period. That is, the XOR gate may output an output signal 2×Fo that is double the output frequency Fo output from the voltage controlled oscillator 100. The XOR gate 200 may double the output frequency of the ring VCO that outputs the multi-phase signal. However, if two input signals that are input to the XOR gate 200 do not have the same propagation delay, the time delay between the input signals may differ, and thus the value of a deterministic jitter (DJ) may be increased.

The deterministic jitter (DJ) of the frequency doubler 1 that includes the voltage controlled oscillator 100 and the XOR gate 200 may be changed due to differences in 1) uniformity of time delays between delay units, 2) uniformity of propagation delays between the delay units, and 3) R/C time constant between metal lines from the delay unit to the XOR gate 200.

Figure 3:
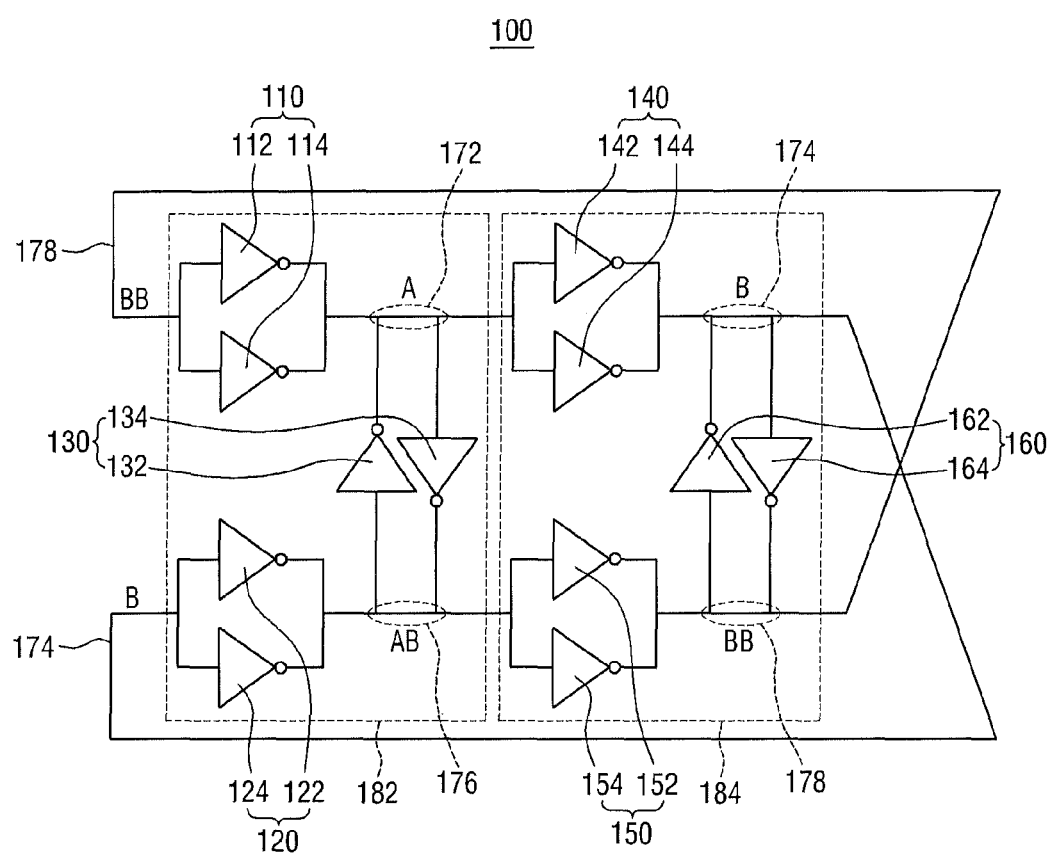
FIG. 3 is a block diagram illustrating a voltage controlled oscillator according to an exemplary embodiment of the present inventive concepts.
Figure 4:
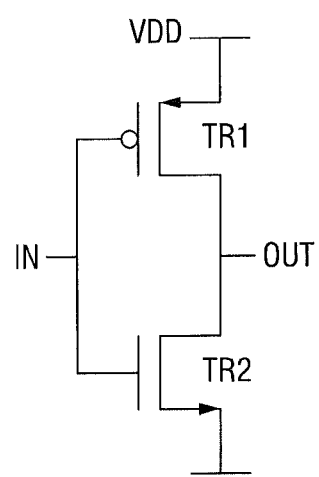
FIG. 4 is a circuit diagram illustrating an inverter that is included in an inverter unit of a voltage controlled oscillator according to an exemplary embodiment of the present inventive concepts.

FIG. 3 is a block diagram illustrating a voltage controlled oscillator according to an exemplary embodiment of the present inventive concepts, and FIG. 4 is a circuit diagram illustrating an inverter that is included in an inverter unit of a voltage controlled oscillator according to an exemplary embodiment of the present inventive concepts.

Referring to FIGS. 2 and 4, the voltage controlled oscillator 100 according to an exemplary embodiment of the present inventive concepts may include a first stage 182 and a second stage 184. The voltage controlled oscillator 100 may include N nodes that correspond to N signals having different N phases, and a plurality of inverter units connected to the N nodes, respectively.

For example, the voltage controlled oscillator 100 may output first to fourth signals having different phases, and may include first to fourth nodes BB, A, B and AB that correspond to the first to fourth signals. In this case, a signal having a phase of 0° may be output at the second node A 172, and a signal having a phase of 90° may be output at the third node (B 174. Further, a signal having a phase of 180° may be output at the fourth node AB 176, and a signal having a phase of 270° may be output at the first node BB 178. However, the present inventive concepts are not limited thereto, but the phases of the respective signals may vary in a predetermined ratio. However, the phase difference between the respective signals may be kept constant.

That is, the voltage controlled oscillator 100 may include a 2-stage ring oscillator circuit that generates four multi-phase clocks having the phases of 0°, 90°, 180°, and 270°. The four multi-phase clocks may correspond to the first to fourth signals of the N nodes BB, A, B and AB. However, the present inventive concepts are not limited thereto.

The voltage controlled oscillator 100 may include the plurality of inverter units 110 to 160. The first stage 182 may include the first inverter unit 110 that inverts the signal of the first node BB to output the inverted signal to the second node A, the second inverter unit 120 that inverts the signal of the third node B to output the inverted signal to the fourth node AB, and the third inverter unit 130 that inverts the signal of the second node A to output the inverted signal to the fourth node AB or inverts the signal of the fourth node AB to output the inverted signal to the second node A.

The second stage 184 may include the fourth inverter unit 140 that inverts the signal of the second node A to output the inverted signal to the third node B, the fifth inverter unit 150 that inverts the signal of the fourth node AB to output the inverted signal to the first node BB, and the sixth inverter unit 160 that inverts the signal of the third node B to output the inverted signal to the first node BB or inverts the signal of the first node BB to output the inverted signal to the third node B.

Each of the first inverter unit 110 and the second inverter unit 120 of the first stage 182 may include a pair of inverters that share the same input node and output node. That is, a first inverter 112 and a second inverter 114 of the first inverter unit 110 may have input terminals connected to the first node BB and output terminals connected to the second node A. In the same manner, a first inverter 122 and a second inverter 124 of the second inverter unit 120 may have input terminals connected to the first node BB and output terminals connected to the second node A.

The third inverter unit 130 may include a first inverter 132 that inverts the signal of the second node A to output the inverted signal to the fourth node AB and a second inverter 134 that inverts the signal of the fourth node AB to output the inverted signal to the second node A.

Each of the fourth inverter unit 140 and the fifth inverter unit 150 of the second stage 184 may include a pair of inverters that share the same input node and output node. That is, a first inverter 142 and a second inverter 144 of the fourth inverter unit 140 may have input terminals connected to the second node A and output terminals connected to the third node B. In the same manner, a first inverter 152 and a second inverter 154 of the fifth inverter unit 150 may have input terminals connected to the fourth node AB and output terminals connected to the first node BB.

The sixth inverter unit 160 may include a first inverter 162 that inverts the signal of the third node B to output the inverted signal to the first node BB and a second inverter 164 that inverts the signal of the first node BB to output the inverted signal to the third node B.

The first stage 182 and the second stage 184 may be configured substantially in the same manner, and may be symmetrically arranged on a substrate.

The plurality of inverter units 110 to 160 may be connected between the N nodes BB, A, B and AB corresponding to the N signals, each of which is generated by an inverter chain having a same number of the plurality of inverter units 110 to 160. The voltage controlled oscillator 100 includes a plurality of inverter units connected to N nodes corresponding to the N signals, each of the N signals being generated by a same number of the plurality of inverter units on a recursive path. In other words, the N nodes BB, A, B and AB may be arranged so that, if a signal that starts from any one start node of the N nodes BB, A, B and AB passes through the same number of inverter units, it recurs to the corresponding start node.

For example, if the signal that starts from the second node A sequentially passes through the fourth inverter unit 140, the sixth inverter unit 160, and the first inverter unit 110, it recurs to the second node A. In the same manner, if the signal that starts from the third node B sequentially passes through the second inverter unit 120, the third inverter 130, and the fourth inverter unit 140, it recurs to the third node B. According to the voltage controlled oscillator 100 having the four nodes BB, A, B and AB according to an exemplary embodiment of the present inventive concepts as described above, if the signal passes through three inverter units, it recurs to its start node. This means that the signals that are output from the respective nodes may have equal time delays.

Further, the voltage controlled oscillator 100 may include a same type inverters to provide substantially equal time delays between phases. As described above, each of the first to sixth inverter units 110 to 160 may include a same type of two inverters.

Referring to FIG. 4, the first to sixth inverter units 110 to 160 may be composed of same inverters. The inverter (e.g., 112) may include a PMOS transistor TR1 and an NMOS transistor TR2. A source of the PMOS transistor TR1 is connected to a VDD terminal, and a drain thereof is connected to a drain of the NMOS transistor TR2. The source of the NMOS transistor TR2 is connected to a VSS terminal. The gates of the PMOS transistor TR1 and the NMOS transistor TR2 are connected to the same input terminal IN, the drains of the PMOS transistor TR1 and the NMOS transistor TR2 are connected to the same output terminal OUT. However, the configuration of the inverters according to the present inventive concepts is not limited thereto.

Figure 5:
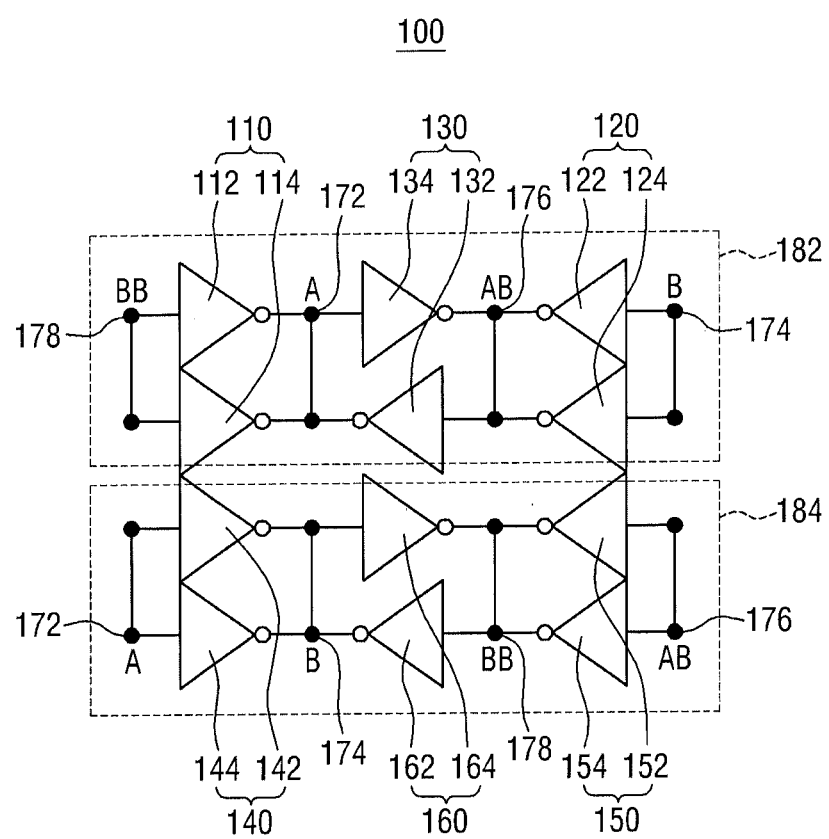
FIG. 5 is a block diagram illustrating the voltage controlled oscillator of FIG. 3 in another way.
Figure 6:
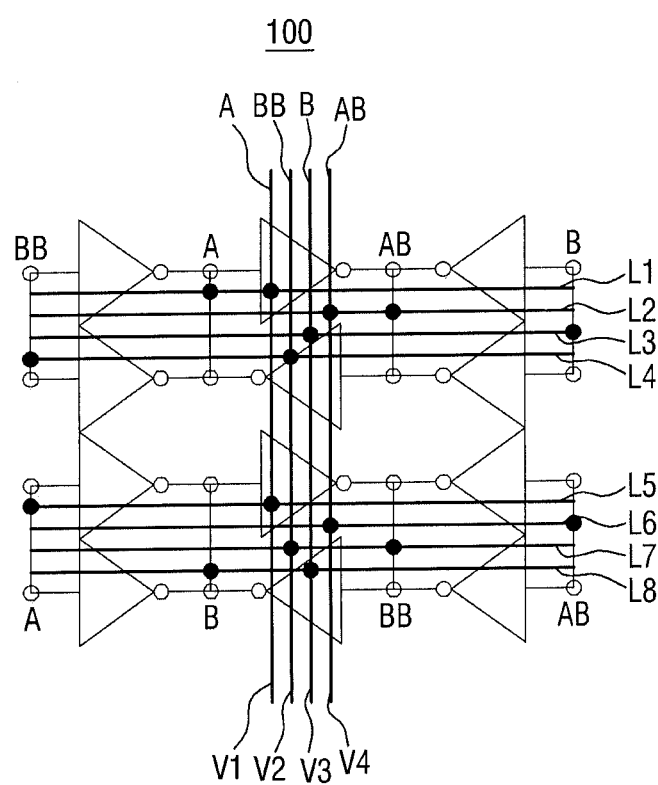
FIG. 6 is a schematic diagram illustrating metal lines connected to a voltage controlled oscillator according to an exemplary embodiment of the present inventive concepts.

FIG. 5 is a block diagram illustrating the voltage controlled oscillator of FIG. 3 in another way, and FIG. 6 is a diagram illustrating a plurality of metal lines connected to a voltage controlled oscillator according to an exemplary embodiment of the present inventive concepts. Hereinafter, for convenience in explanation, the duplicate explanation of the same terms as those according to the above-described embodiment will be omitted, and explanation will be made around different points between the exemplary embodiments.

FIG. 5 illustrates a schematic and layout pattern of the voltage controlled oscillator 100 that can reduce the mismatch between the transistors and the R/C time constant mismatch. The voltage controlled oscillator 100 may include 12 inverters having the same size. Further, the first to sixth inverter units 110 to 160, each of which may include a pair of inverters, may be arranged in a common centroid manner to reduce certain random mismatch effects of the transistors.

As described above, the plurality of inverter units 110 to 160 may be connected between the N nodes BB, A, B and AB corresponding to the N signals, each of which is generated by an inverter chain having a same number of the plurality of inverter units 110 to 160. That is, the inverter units 110 to 160 may be arranged so that, if a signal that starts from any one start node of the respective nodes passes through the same number of the inverter units, it recurs to the corresponding start node. In this case, since the signals that are output from the respective nodes have the same routing paths, the mismatch between the transistors and the R/C time constant mismatch can be reduced.

Specifically, the first inverter unit 110 and the second inverter unit 120 of the first stage 182 may be symmetrically arranged about the third inverter unit 130. In the same manner, the fourth inverter unit 140 and the sixth inverter unit 160 of the second stage 184 may be symmetrically arranged about the fifth inverter unit 150. The first stage 182 and the second stage 184 may be configured substantially in the same manner, and may be symmetrically arranged with each other on a substrate. However, the present inventive concepts are not limited thereto.

Referring to FIG. 6, each of the first stage 182 and the second stage 184 may include first to fourth nodes BB, A, B and AB. The node of the first stage 182 and the node of the second stage 184 may be connected to the plurality of metal lines.

The plurality of metal lines may include a plurality of horizontal-axis metal lines L1 to L8 and a plurality of vertical-axis metal lines V1 to V4. The plurality of horizontal-axis metal lines L1 to L8 may include a plurality of metal lines which are horizontally arranged and have the same length, and the plurality of vertical-axis metal lines V1 to V4 may include a plurality of metal lines which are vertically arranged and have the same length. For example, a first plurality of horizontal-axis metal lines L1 to L4 may be arranged at predetermined intervals to overlap the first to third inverter units 110, 120 and 130 of the first stage 182. In the same manner, a second plurality of horizontal-axis metal lines L5 to L8 may be arranged at predetermined intervals to overlap the fourth to sixth inverter units 140, 150 and 160. However, the present inventive concepts are not limited thereto.

The plurality of vertical-axis metal lines V1 to V4 may be arranged to pass the centers of the first stage 182 and the second stage 184. For example, the plurality of vertical-axis metal lines V1 to V4 may be arranged at predetermined intervals to overlap the third inverter unit 130 and the sixth inverter unit 160. However, the present inventive concepts are not limited thereto.

The first plurality of horizontal-axis metal lines L1 to L4 may be connected to the first to fourth nodes of the first stage 182, respectively. For example, a first horizontal-axis metal line L1 may be connected to the second node A, and a second horizontal-axis metal line L2 may be connected to the fourth node AB. However, the present inventive concepts are not limited thereto. In the same manner, the second plurality of horizontal-axis metal lines L5 to L8 may be connected to the first to fourth nodes of the second stage 184, respectively.

Each of the plurality of vertical-axis metal lines V1 to V4 may connect the first plurality of horizontal-axis metal lines L1 to L4 and the second plurality of horizontal-axis metal lines L5 to L8 at the first to fourth nodes BB, A, B and AB. For example, a first vertical-axis metal line V1 may be connected to the first horizontal-axis metal line L1 and a fifth horizontal-axis metal line L5 that are connected to the second node A, and a second vertical-axis metal line V2 may be connected to a fourth horizontal-axis metal line L4 and a seventh horizontal-axis metal line L7 that are connected to the first node BB. However, the present inventive concepts are not limited thereto.

Further, the plurality of metal lines L1 to L8 and V1 to V4 may be arranged in a matrix form to equally maintain the line lengths, widths, thicknesses or distances of the plurality of metal lines L1 to L8 and V1 to V4. As a result, the signals that are output from the respective nodes BB, A, B and AB may have the same routing paths, and thus the mismatch between the transistors and the R/C time constant mismatch can be reduced.

Figure 7:
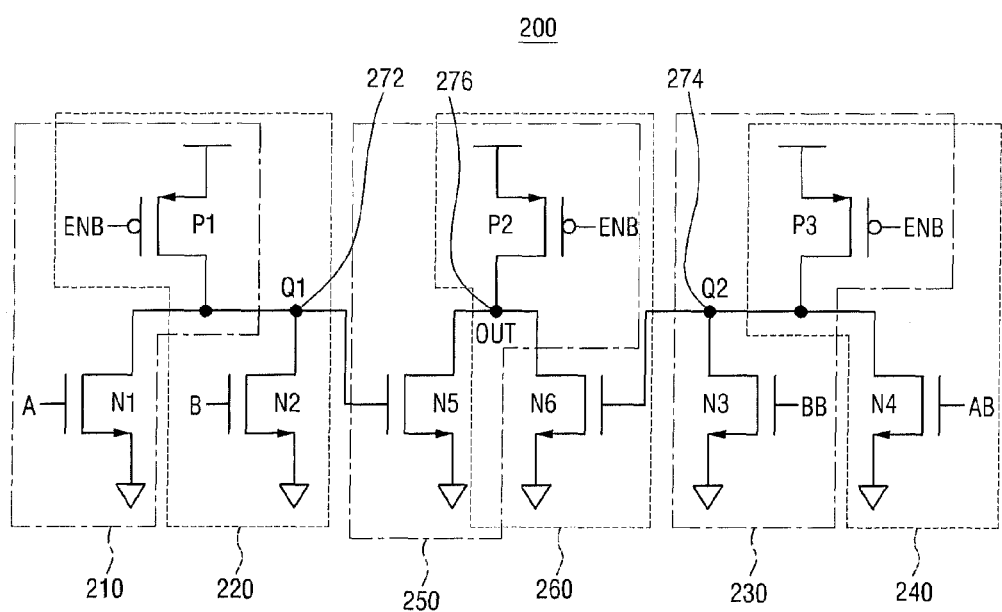
FIG. 7 is a circuit diagram illustrating an XOR gate according to an exemplary embodiment of the present inventive concepts.
Figure 8:
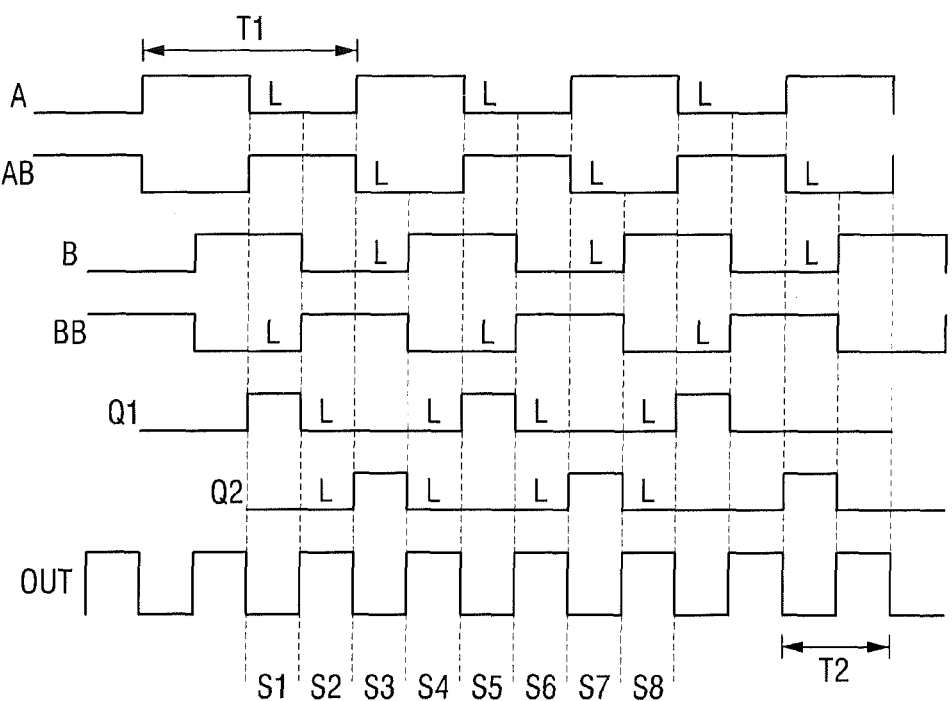
FIG. 8 is a timing diagram illustrating an operation of an XOR gate according to an exemplary embodiment of the present inventive concepts.

FIG. 7 is a circuit diagram illustrating an XOR gate according to an exemplary embodiment of the present inventive concepts, and FIG. 8 is a timing diagram illustrating an operation of an XOR gate according to an exemplary embodiment of the present inventive concepts.

Referring to FIGS. 7 and 8, an XOR gate 200 may have a same propagation delay for all input nodes BB, A, B, AB to an output node OUT. The XOR gate 200 may include first to fourth input inverters 210, 220, 230 and 240 and first and second output inverters 250 and 260.

The first input inverter 210 may include a first PMOS transistor P1 and a first NMOS transistor N1. The second input inverter 220 may include the first PMOS transistor P1 and a second NMOS transistor N2. The third input inverter 230 may include a second PMOS transistor P3 and a third NMOS transistor N3. The fourth input inverter 240 that includes the second PMOS transistor P3 and a fourth NMOS transistor N4. The first output inverter 250 may be connected to the drain of the first PMOS transistor P1 and may include a third PMOS transistor P2 and a fifth NMOS transistor N5. The second output inverter 260 may be connected to the drain of the second PMOS transistor P3 and may include the third PMOS transistor P2 and a sixth NMOS transistor N6. That is, the first input inverter 210 and the second input inverter 220 may share the first PMOS transistor P1, and the third input inverter 230 and the fourth input inverter 240 may share the second PMOS transistor P3. The first output inverter 250 and the second output inverter 260 may share the third PMOS transistor P2.

An output of the first inverter 210 and an output of the second input inverters 220 may be connected to an input of the first output inverter 250 at node Q1, and an output of the third input inverter 230 and an output of the fourth input inverters 240 may be connected to an input of the second output inverter 260 at node Q2.

In this case, a second signal of a second node A having a first period may be input to the first NMOS transistor N1, and a third signal of a third node B that is different from the second signal of the second node A having the first period may be input to the second NMOS transistor N2. Further, a first signal of a first node BB may be an inverted signal of the third signal of the third node B and may be input to the third NMOS transistor N3. a fourth signal of a fourth node AB may be an inverted signal of the second signal of the second node A and may be input to the fourth NMOS transistor N4. A phase difference of ¼ period may exist between the first signal of the first node BB and the second signal of the second node A. However, the present inventive concepts are not limited thereto.

An enable signal ENB that controls the first to third PMOS transistors P1 to P3 may be equally applied to the gate terminals of the first to third PMOS transistors P1 to P3. If the enable signal ENB is low, the XOR gate 200 can operate. In contrast, if the enable signal ENB is high, the XOR gate does not operate.

Each source of the first to third PMOS transistors P1 to P3 may be connected to the VDD. A drain of the first PMOS transistor P1 may be connected to a node Q1 272. The node Q1 272 may be connected to a drain of the first NMOS transistor N1, a drain of the second NMOS transistor N2, and a gate of the fifth NMOS transistor N5.

In the same manner, a drain of the second PMOS transistor P3 may be connected to a node Q2 274. The node Q2 274 may be connected to a drain of the third NMOS transistor N3, a drain of the fourth NMOS transistor N4, and a gate of the sixth NMOS transistor N6.

The first output inverter 250 and the second output inverter 260 may share the output node OUT. The output node OUT may output an oscillating signal having the second period that corresponds to a half of the first period of the signal that is input from the voltage controlled oscillator 100. That is, The XOR gate 200 may output a signal having a frequency that is double the input signal frequency of the voltage controlled oscillator 100.

The circuit of the first input inverter 210 and the second input inverter 220, which are connected to the first output inverter 250, and the circuit of the third input inverter 230 and the fourth input inverter 240, which are connected to the second output inverter 260, may be arranged on a substrate (not illustrated) in the substantially same manner. That is, the XOR gate 200 according to an exemplary embodiment of the present inventive concepts may be symmetrically arranged about the output node OUT on the substrate (not illustrated).

The XOR gate 200 according to the present inventive concepts, there are only two transistors at maximum connected between VDD and VSS, and thus the operating speed can be increased. Further, by reducing the number of elements that are used, the XOR gate 200 may be less affected by a change of the semiconductor manufacturing process. Further, since the signals that are output through the respective inputs have the same routing paths, the mismatch between the transistors and the R/C time constant mismatch can be reduced. That is, the uniformity of the propagation delay from the input to the output can be secured.

FIG. 8 is a timing diagram of the XOR gate 200. The XOR gate 200 may receive the first to fourth signals of the first to fourth nodes BB, A, B and AB having multi-phases of the voltage controlled oscillator 100. The first to fourth signals may have a phase difference of 90° with each other. The node Q1 272 of FIG. 7 may have a low-level value when one of signals of the second node A and the first node BB becomes high. The node Q2 274 may have a low-level value when one of the signals of the third node B and the fourth node AB becomes high. The first to third PMOS transistors P1 to P3 may always operate in a turn-on state, and if the XOR gate 200 does not operate, the first to third PMOS transistor P1 to P3 may be turn off using the enable signal ENB. The outputs of the node Q1 272 and the node Q2 274 may be expressed as in Equation 1 below.

$$Q1=\overline{(A+\overline{BB})}=\overline{A}\cdot B, Q2=\overline{(\overline{AB}+B)}=A\cdot \overline{B} \qquad \text{[Equation 1]}$$

The output node OUT may be in a high state when both the node Q1 272 and the node Q2 274 become low. For example, in the case of a time period S2, both the node Q1 272 and the node Q2 274 become low, and thus the output node OUT has a high-level value. In the case of time periods S4, S6, and S8, the output node OUT has a high-level value in the same manner.

The output of the output node OUT may be expressed as in Equation 2 below.

$$\text{OUT}=\overline{Q1}+\overline{Q2}=Q1+Q2=\overline{A}\cdot B+A\cdot \overline{B} \qquad \text{[Equation 2]}$$

As can be known through Equation 1 and Equation 2 as described above, the output signal of the output node OUT may be defined as an XOR function of the node A and the node B.

The signals of the first to fourth nodes BB, A, B and AB that are provided from the voltage controlled oscillator 100 may have a first period T1, whereas the signal that is output from the XOR gate 200 may have a second period T2 that corresponds to a half of the first period. As a result, the XOR gate 200 can provide the output signal having a frequency that is double the frequency of the input signal.

Figure 9:
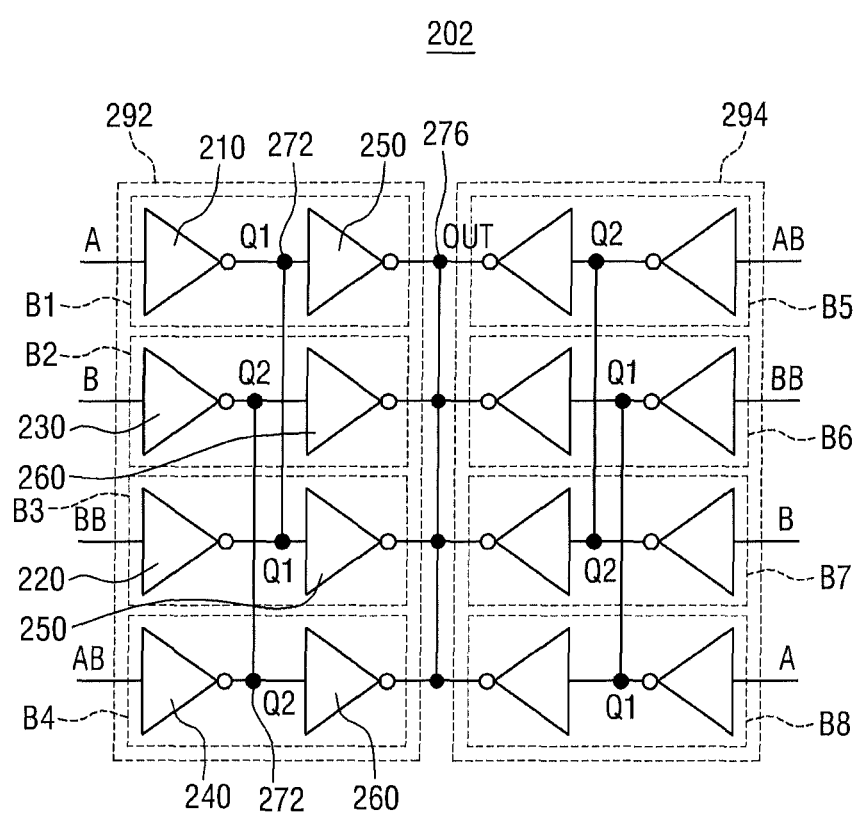
FIG. 9 is a block diagram illustrating an XOR gate according to an exemplary embodiment of the present inventive concepts.
Figure 10:
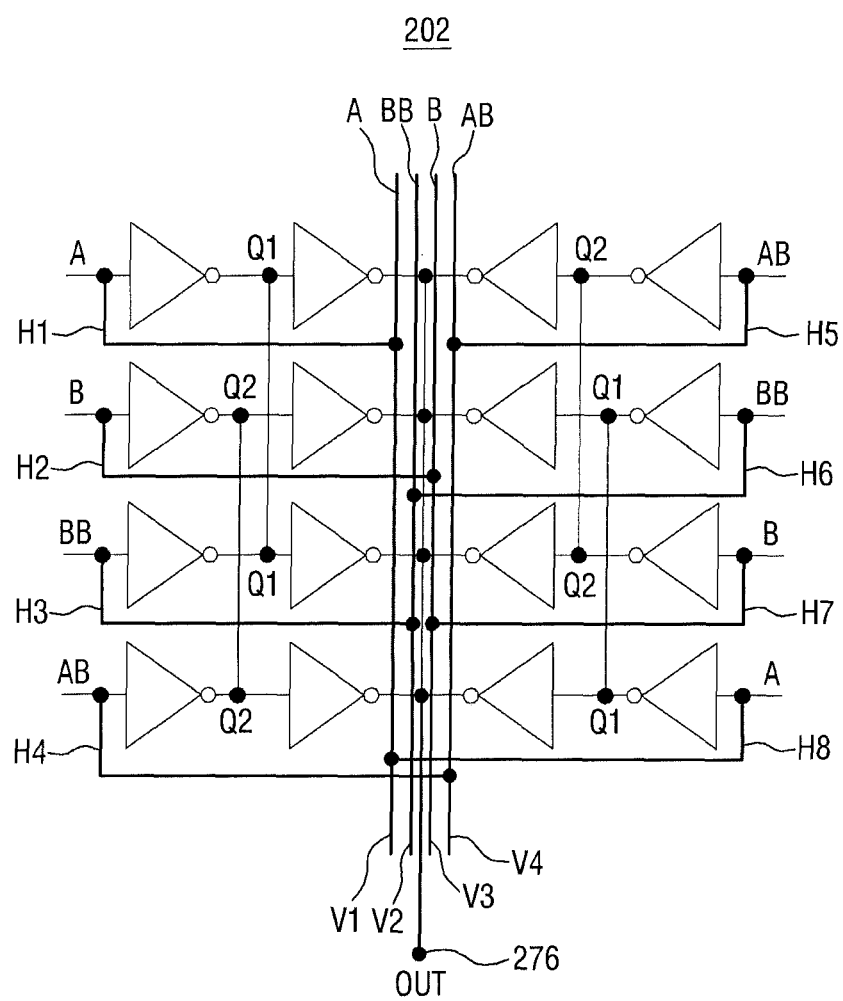
FIG. 10 is a block layout illustrating metal lines connected to an XOR gate according to an exemplary embodiment of the present inventive concepts.

FIG. 9 is a block diagram illustrating an XOR gate according to an exemplary embodiment of the present inventive concepts, and FIG. 10 is a block diagram illustrating metal lines connected to an XOR gate according to an exemplary embodiment of the present inventive concepts. Hereinafter, for convenience in explanation, the duplicate explanation of the same terms as those according to the above-described embodiment will be omitted, and explanation will be made around different points between the exemplary embodiments.

Referring to FIG. 9, an XOR gate 202 according to an exemplary embodiment of the present inventive concepts includes a first unit block set 292 and a second unit block set 294.

The first unit block set 292 may be connected to an output node OUT and may include N unit blocks, each of which is connected to the node OUT and is connected to one of N nodes, respectively. For example, the first unit block set 292 may include first to fourth unit blocks B3, B1, B2 and B4, each of which is connected to each of the first to fourth nodes BB, A, B and BB, respectively. However, the present inventive concepts are not limited thereto.

The first unit block set 292 and the second unit block set 294 may include substantially the same configuration as the configuration of the XOR gate 200 as described above with reference to FIG. 7. The second unit block set 294 may be formed to be substantially the same as the first unit block set 292. The second unit block set 294 may share the output node OUT with the first unit block set 292. That is, the first unit block set 292 and the second unit block set 294 may be symmetrically arranged about the output node OUT on a substrate (not illustrated).

Specifically, the first unit block set 292 may include the first to fourth unit blocks B3, B1, B2 and B4, and the second unit block set 294 may include fifth to eighth unit blocks B6, B8, B7 and B5. Each of the first to fourth unit blocks B3, B1, B2 and B4 may be connected to each of first to fourth signals of the first to fourth node BB, A, B and BB having different phases, respectively. In the same manner, each of the fifth to eighth unit blocks B6, B8, B7 and B5 may be connected to the first to fourth signals of the first to fourth node BB, A, B and BB having different phases, respectively.

Further, each of the unit blocks B1 to B8 may include an input inverter to which any one of the first to fourth signals is input, and an output inverter that receives an output of the input inverter as its input. For example, the second unit block B1 may include a first input inverter 210 and a first output inverter 250, and the first unit block B3 may include a second input inverter 220 and a first output inverter 250. However, the present inventive concepts are not limited thereto.

The second signal of the second node A may be input to the second unit block B1, and the third signal of the third node B that is different from the first signal BB may be input to the second unit block B2. Further, the first signal of the first node BB that corresponds to an inverted signal of the third signal of the third node B may be input to the third unit block B3, and the fourth signal of the fourth node AB that corresponds to an inverted signal of the first signal of the second node A may be input to the fourth block B4.

Further, the second unit block B1 and the first unit block B3 may share the node Q1 272 that connects the input inverters 210 and 220, and the output inverters 250 to each other, and the second unit block B2 and the fourth unit block B4 may share the node Q2 274 that connects the input inverters 230 and 240, and the output inverters 260 to each other. The second unit block set 294 may include fifth to eighth unit block B6, B8, B7 and B5 that are connected to each other in the same manner as described above about the first unit block set 292.

FIG. 10 illustrates connections of signals of the nodes BB, A, B, and AB having different phases, which are input from the voltage controlled oscillator 100.

The XOR gate 202 includes a plurality of vertical-axis metal lines V1 to V4 and a plurality of connection metal lines H1 to H8. The plurality of vertical-axis metal lines V1 to V4 may be arranged at predetermined intervals in the center of the XOR gate 202.

A first plurality of connection metal lines H1 to H4 may connect inputs of the first to fourth unit blocks B3, B1, B2 and B4 to the plurality of vertical-axis metal lines V1 to V4. In the same manner, a second plurality of connection metal lines H5 to H8 may connect inputs of the fifth to eighth unit blocks B6, B8, B7 and B5 to the plurality of vertical-axis metal lines V1 to V4. The first plurality of connection metal lines H1 to H4 and the second plurality of connection metal lines H5 to H8 may be symmetrically arranged about the plurality of vertical-axis metal lines V1 to V4. The first plurality of connection metal lines H1 to H4 and the second plurality of connection metal lines H5 to H8 may be formed to have the same length, the same width, and the same thickness. However, the present inventive concepts are not limited thereto.

The XOR gate 202 is configured to have the same routing paths of the metal lines for the respective unit blocks, and thus a characteristic mismatch of transistors and a R/C time constant mismatch can be reduced.

According to the XOR gate 200 according to an exemplary embodiment of the present inventive concepts as described above with reference to FIG. 7, when a random mismatch occurs between the transistors, deviation occurs between propagation delays to heighten a deterministic jitter (DJ). In contrast, according to the XOR gate 202 according to an exemplary embodiment of the present inventive concepts as described above with reference to FIG. 10, the elements can be arranged in a common centroid manner. That is, in the XOR gate 202, inverters, each of which is composed of two transistors, are arranged in a common centroid manner on a plane, and thus the occurrence of the random mismatch of the process can be reduced. Further, by providing two or more paths for an input signal of each of the first to fourth nodes BB, A, B, and AB having four phases and arranging all outputs to be centered on the output node OUT, the occurrence of mismatch between the moving paths can be reduced.

Figure 11:
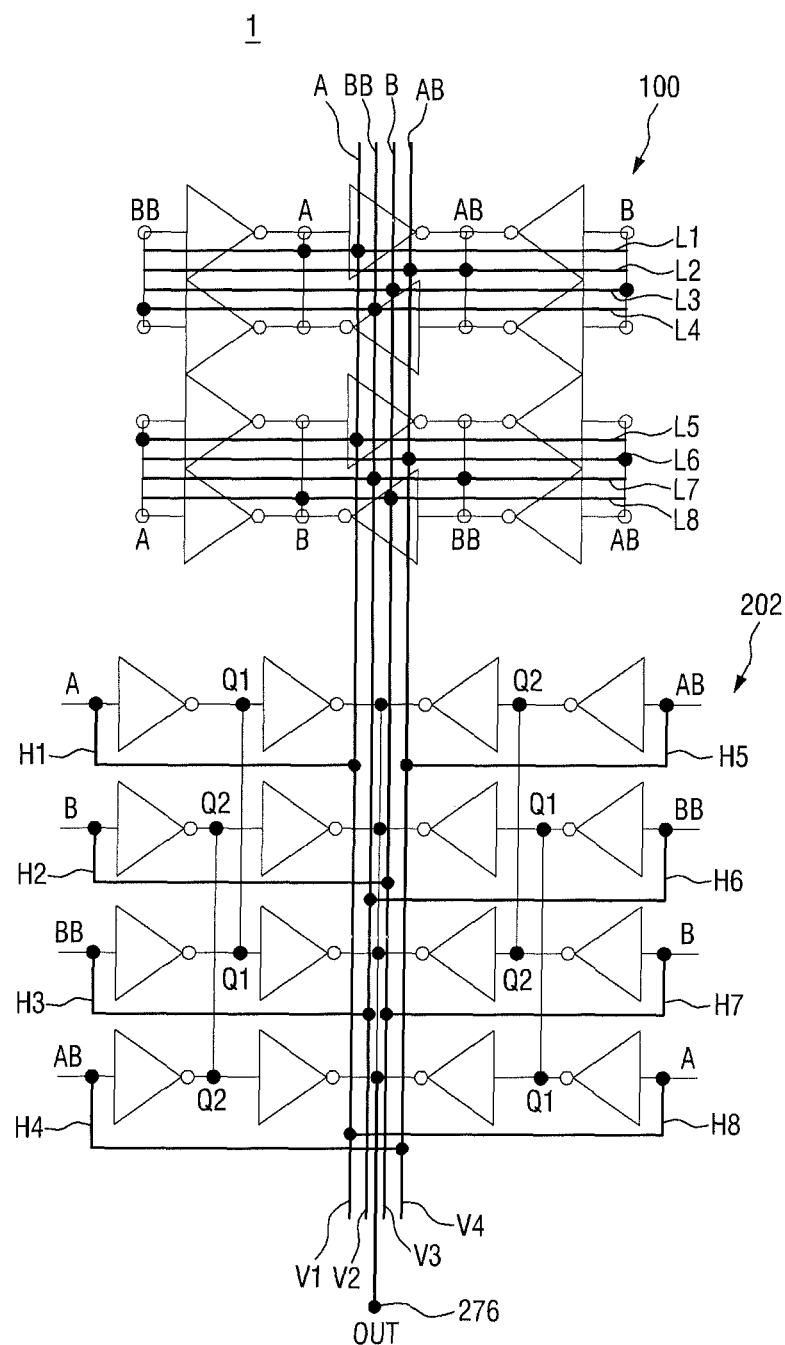
FIG. 11 is a block layout illustrating metal lines of a frequency doubler according to an exemplary embodiment of the present inventive concepts.

FIG. 11 is a block diagram illustrating metal lines of a frequency doubler according to an exemplary embodiment of the present inventive concept. Hereinafter, for convenience in explanation, the duplicate explanation of the same terms as those according to the above-described embodiment will be omitted, and explanation will be made around different points between the exemplary embodiments.

FIG. 11 illustrates a frequency doubler 1 in which the voltage controlled oscillator 100 as described above with reference to FIG. 6 and the XOR gate 202 as described above with reference to FIG. 10 are connected to each other.

The frequency doubler 1 includes the voltage controlled oscillator 100 that includes inverters, and the XOR gate 202. The voltage controlled oscillator 100 and the XOR gate 202 may be arranged in a common centroid manner on a substrate (not illustrated). For this, the frequency doubler 1 may be configured so that all elements connected to a plurality of vertical-axis metal lines V1 to V4 have the same routing paths. Further, since the frequency doubler 1 can secure uniformity of the time delay between the delay units and uniformity of the propagation delay from the inputs of the nodes BB, A, B and AB to the output of the node OUTPUT of the XOR gate 202, and can reduce the difference in R/C time constant between the metal lines from the delay unit to the XOR gate 202, the deterministic jitter (DJ) due to the phase mismatch can be reduced.

Figure 12:
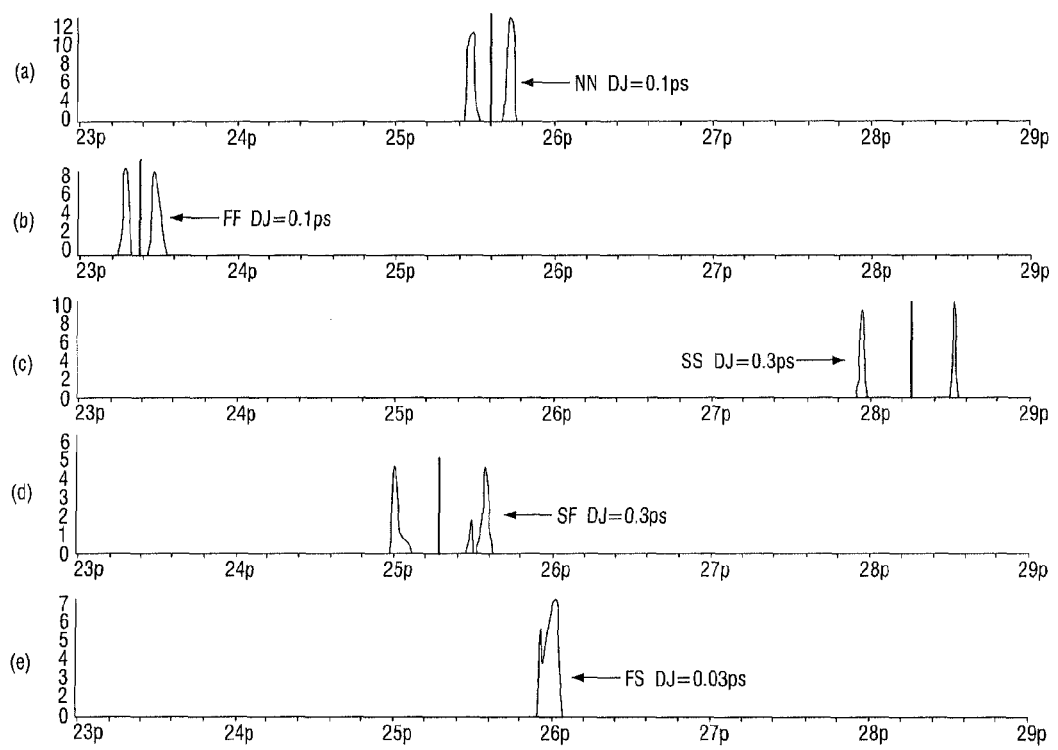
FIG. 12 is a graph illustrating simulation results of five process corners of a frequency doubler according to exemplary embodiments of the present inventive concepts.
Figure 13:
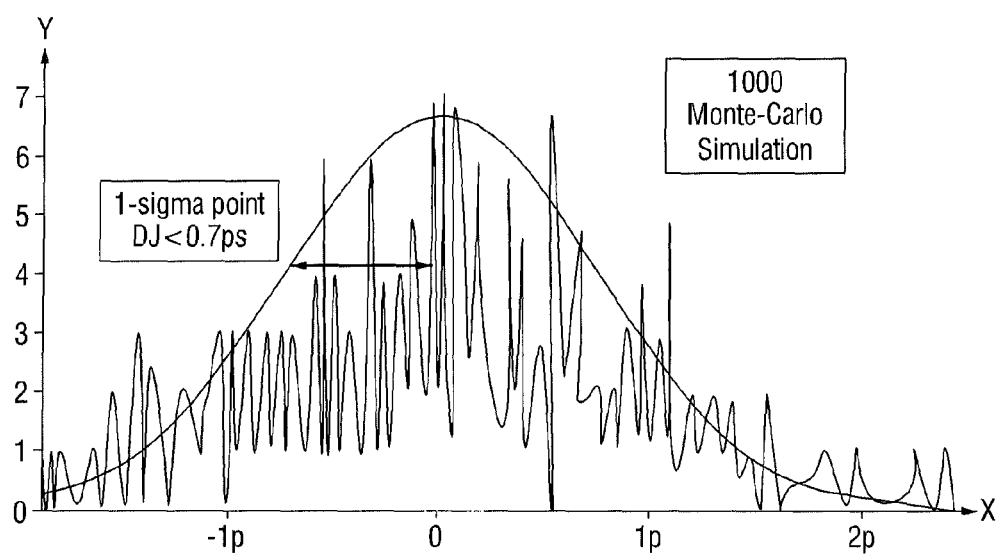
FIG. 13 is a graph illustrating the simulation result of a Monte-Carlo simulation of a frequency doubler according to exemplary embodiments of the present inventive concepts.

FIG. 12 is a graph explaining simulation results of five process corners of a frequency doubler according to exemplary embodiments of the present inventive concepts, and FIG. 13 is a graph explaining the simulation result of a Monte-Carlo simulation of a frequency doubler according to exemplary embodiments of the present inventive concepts. The X-axis in FIG. 12 is a period of an output of the frequency doubler 1, and the Y-axis is a number of occurrence of the period of the output of the frequency doubler 1.

Referring to FIG. 12, (a) to (e) of FIG. 12 are graphs illustrating deterministic jitters (DJ) of the frequency doubler 1 for specific process corners (e.g., NN/FF/SS/SF/FS). As the result of performing simulations which do not consider the mismatch of the transistors, the deterministic jitter (DJ) appears to have a value between 0.03 ps to 0.3 ps. Through this, it can be known that the R/C delay mismatch between the metal lines is very small in the frequency doubler 1 according to exemplary embodiments of the present inventive concepts.

FIG. 13 a graph illustrating the result of performing the Monte-Carlo simulation for testing the operation through a random change of the process in the frequency doubler 1. The X-axis in FIG. 13 is period difference from a center of the period of the output of the frequency doubler 1, and the Y-axis is a number of occurrence of the period difference.

As the results of performing the Monte-Carlo simulations 1000 times, the frequency doubler 1 according to exemplary embodiments of the present inventive concepts showed the deterministic jitter (DJ) value of 2.1 ps at maximum. However, in a semiconductor device that includes the actually manufactured frequency doubler 1, much smaller deterministic jitter (DJ) value of 0.3 ps was showed. This is because in the case of the Monte-Carlo simulation, very large mismatch may be generated even between two neighboring elements, whereas in the case of the semiconductor device including the actually implemented frequency doubler 1, the performance deviation between the two adjacent elements is very small enough to be disregarded. Typically, deviation of about 1-sigma is considered in the Monte-Carlo simulation, and thus it can be predicted that the actually manufactured semiconductor device has the deterministic jitter (DJ) value of less than 0.7 ps at maximum even in consideration of all mismatch situations.

Figure 14:
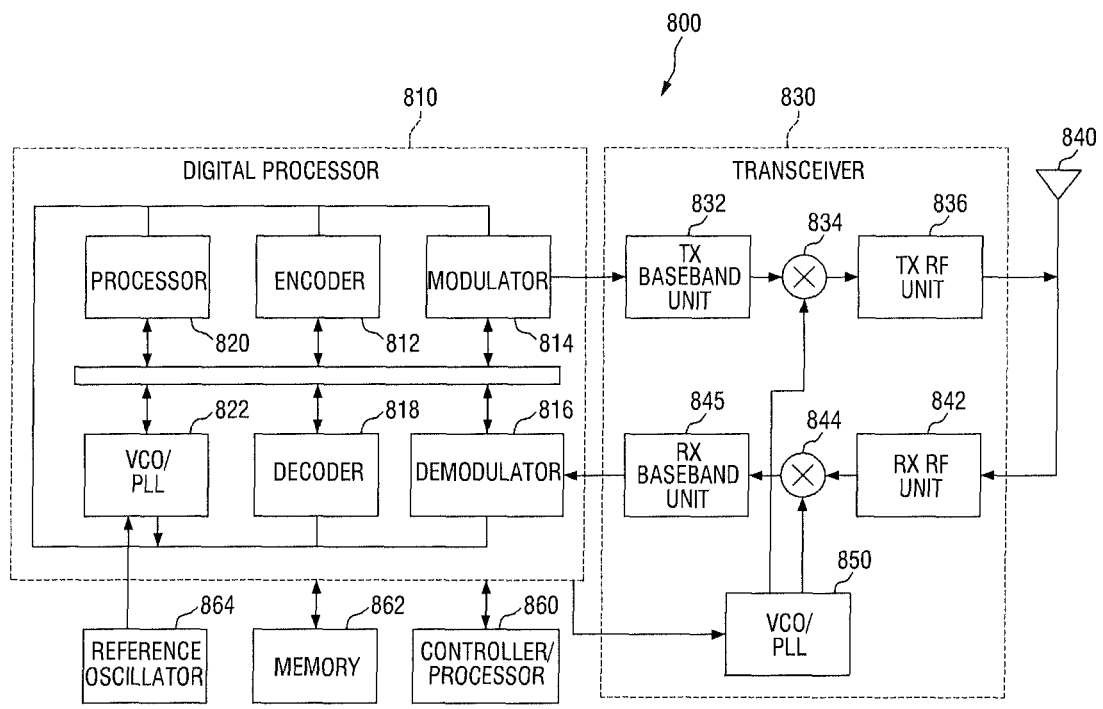
FIG. 14 is a block diagram illustrating a wireless device that includes a frequency doubler according to embodiments of the present inventive concepts.

FIG. 14 is a block diagram of a wireless device that includes a frequency doubler according to embodiments of the present inventive concepts.

Referring to FIG. 14, a wireless device 800 may be a cellular phone, a terminal, a PDA (Personal Digital Assistant), a handset, or any other device. A wireless communication system may include a code division multiple access (CDMA) system, a time division multiple access (TDMA) system, a frequency division multiple access (FDMA) system, a mobile communication globalization (GSM) system, an orthogonal frequency division multiple access (OFDMA) system, and a wireless LAN (WLAN).

The wireless device 800 includes a digital processor 810 that supports bidirectional communications and a transceiver 830. The digital processor 810 may be implemented by one or more application specific integrated circuits (ASIC). The transceiver 830 may be implemented by one or more wireless frequency integrated circuits (RFIC).

For data transmission, an encoder 812 processes (e.g., formats, encodes, and interleaves) data to be transmitted, and a modulator 814 processes (e.g., modulates and scrambles) coded data to generate a data chip. In the transceiver 830, a transmission (TX) baseband device 832 performs baseband process, such as digital-to-analog conversion, filtering, and amplification. A mixer 834 up-converts a baseband signal into a radio frequency (RF). A TX RF device 836 performs signal conditioning, such as filtering and power amplification, and generates an RF modulated signal that is transmitted through an antenna 840.

For data reception, a reception (RX) RF device 842 receives an input RF signal from the antenna 840, and performs signal conditioning, such as low-noise amplification and filtering. A mixer 844 down-converts the conditioned RF signal into a baseband signal. A RX baseband device 846 performs baseband process, such as filtering, amplification, and analog-to-digital conversion. A demodulator 816 processes (descrambles and demodulates) input samples from the RX baseband device 846 to provide symbol estimate. A decoder 818 processes (de-interleaves and decodes) the symbol estimate and provides decoded data. In general, the processes performed by the data processor 810 and the transceiver 830 may differ according to designs of the wireless system.

A processor 820 may support various applications, such as video, audio, graphics, and others. A controller/processor 860 instructs operations of various processing devices in the wireless device 800. A memory 862 stores program codes and data for the wireless device 800.

A VCO/PLL 822 generates a clock signal with respect to processing devices in the digital processor 810. A VCO/PLL 850 generates a transmission LO signal that is used by a mixer 834 for frequency up-conversion, and generates a reception LO signal that is used by a mixer 844 for frequency down-conversion. The VCO/PLL 822 and the VCO/PLL 850 use a linear phase frequency detector and a charge pump to improve the performance. A reference oscillator 864 generates and provides a reference signal to the VCO/PLL 822 and/or the VCO/PLL 850. The reference oscillator 864 may be a crystal oscillator XO, a voltage controlled XO (VCXO), a temperature compensated XO (TCXO), or any other kind of oscillator.

The phase frequency detector, the charge pump, and the PLL described herein may be implemented in an analog IC, a RFIC, an ASIC, a digital signal processor (DSP), a digital signal processing device (DSPD), a programmable logic device (PLD), a field programmable gate array (FPGA), a processor, a controller, a microcontroller, a microprocessor, and other electronic devices. The phase frequency detector, the charge pump, and the PLL may be manufactured by various IC process techniques, such as N-MOS, P-MOS, CMOS, BJT, GaAs, and others. Further, the phase frequency detector, the charge pump, and the PLL may be implemented by individual components.

Next, referring to FIG. 15, an electronic system that includes a frequency doubler 1 according to embodiments of the present inventive concepts will be described.

Figure 15:
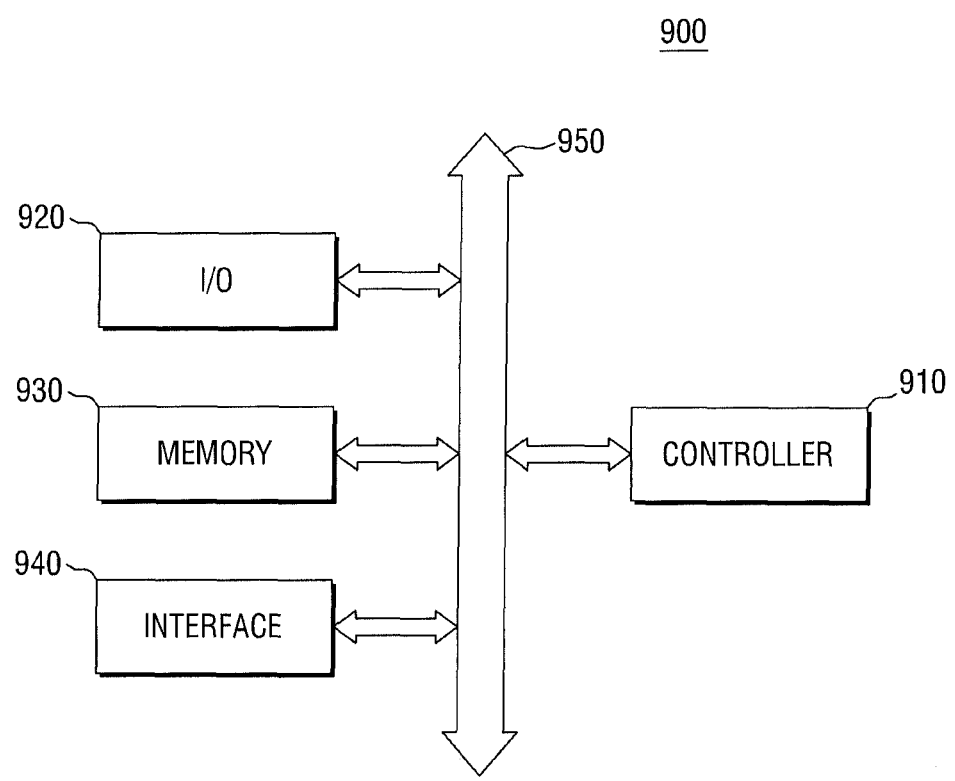
FIG. 15 is a block diagram illustrating an electronic system that includes a frequency doubler according to embodiments of the present inventive concepts.

FIG. 15 is a block diagram of an electronic system that includes a frequency doubler according to embodiments of the present inventive concepts.

Referring to FIG. 15, an electronic system 900 according to an exemplary embodiment of the present inventive concepts may include a controller 910, an input/output (I/O) device 920, a memory 930, an interface 940, and a bus 950. The controller 910, the I/O device 920, the memory 930, and/or the interface 940 may be coupled to one another through the bus 950. The bus 950 corresponds to paths through which data is transferred.

The controller 910 may include at least one of a microprocessor, a digital signal processor, a microcontroller, and logic elements that can perform similar functions. The I/O device 920 may include a keypad, a keyboard, and a display device. The memory 930 may store data and/or commands. The interface 940 may function to transfer the data to a communication network or receive the data from the communication network. The interface 940 may be of a wired or wireless type. For example, the interface 940 may include an antenna or a wire/wireless transceiver.

Although not illustrated, the electronic system 900 may further include a high-speed DRAM and/or SRAM as an operating memory for improving the operation of the controller 910. In this case, as the operating memory, a semiconductor device 99b according to an exemplary embodiment of the present inventive concepts may be adopted. Further, a semiconductor device 98b according to an exemplary embodiment of the present inventive concepts may be provided in the memory 930, or may be provided as a part of the controller 910 or the I/O device 920.

The electronic system 900 may be applied to a PDA (Personal Digital Assistant), a portable computer, a web tablet, a wireless phone, a mobile phone, a digital music player, a memory card, or all electronic devices that can transmit and/or receive information in wireless environments.

Figure 16:
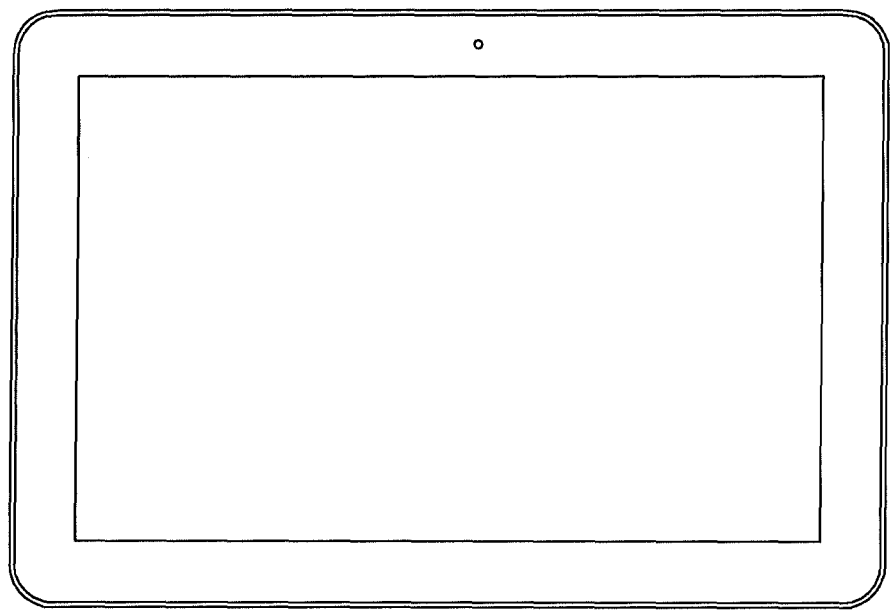
FIGS. 16 to 18 are views illustrating semiconductor systems to which a frequency doubler according to exemplary embodiments of the present inventive concepts can be applied.
Figure 17:
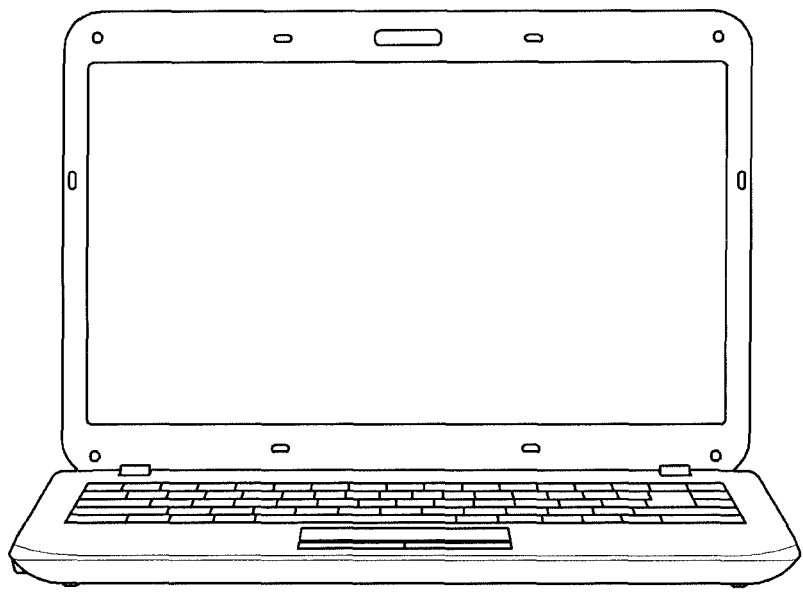
Figure 18:
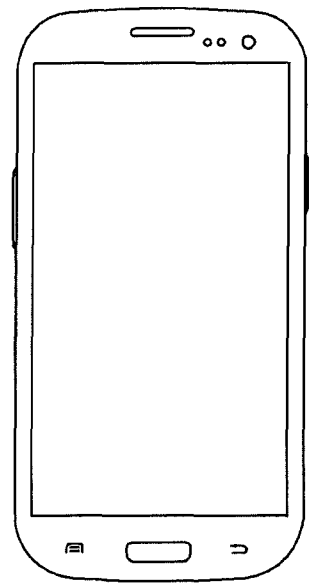

FIGS. 16 to 18 are views of exemplary semiconductor systems to which a frequency doubler according to exemplary embodiments of the present inventive concepts can be applied.

FIG. 16 illustrates a tablet PC 1000, FIG. 17 illustrates a notebook computer 1100, and FIG. 18 illustrates a smart phone 1200. The frequency doubler 1 according to an exemplary embodiment of the present inventive concepts may be used in the tablet PC 1000, the notebook computer 1100, or the smart phone 1200.

Further, it is apparent to those of skilled in the art that the frequency doubler 1 according to exemplary embodiments of the present inventive concepts can also be applied to other integrated circuit devices that have not been exemplified. That is, although the tablet PC 1000, the notebook computer 1100, and the smart phone 1200 have been indicated as examples of the semiconductor system that includes the frequency doubler 1 according to this embodiment, the examples of the semiconductor system that includes the frequency doubler 1 according to this embodiment are not limited thereto. In exemplary embodiments of the present inventive concepts, the semiconductor system may be implemented as a computer, UMPC (Ultra Mobile PC), workstation, net-book, PDA (Personal Digital Assistant), portable computer, wireless phone, mobile phone, e-book, PMP (Portable Multimedia Player), portable game machine, navigation device, black box, digital camera, 3D television set, digital audio recorder, digital audio player, digital picture recorder, digital picture player, digital video recorder, or digital video player.

While the present inventive concepts have been particularly shown and described with reference to exemplary embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the claims.

What is claimed is:

1. A frequency doubler comprising:
a voltage controlled oscillator configured to output N signals having a first period and having different phases, N being a natural number;
an XOR circuit configured to receive the N signals and output a signal having a second period that corresponds to a half of the first period,
wherein the voltage controlled oscillator includes N nodes that correspond to the N signals and inverter units respectively connecting the N nodes,
the N nodes are arranged so that, if a signal that starts from any one start node of the N nodes passes through the same number of the inverter units, it recurs to the corresponding start node,
the XOR gate includes a first unit block set including N unit blocks that are connected to the same output node and match the N nodes in a one-to-one manner, and a second unit block set that is substantially the same as the first unit block set, wherein the first and second unit block sets share the output node, wherein the first unit block set comprises a first output inverter connected to a drain of a first PMOS transistor of the XOR gate and including a third PMOS transistor and a fifth NMOS transistor; and
a second output inverter connected to a drain of a second PMOS transistor of the XOR gate and including the third PMOS transistor and a sixth NMOS transistor that is different from the fifth NMOS transistor.

2. The frequency doubler of claim 1, wherein the voltage controlled oscillator outputs first to fourth signals having different phases, and includes first to fourth nodes that respectively correspond to the first to fourth signals.

3. The frequency doubler of claim 2, wherein the voltage controlled oscillator comprises:
a first stage that includes:
a first inverter unit configured to invert a signal of the first node and output the inverted signal to the second node;
a second inverter unit configured to invert a signal of the third node that is different from the first node and output the inverted signal to the fourth node that is different from the second node; and
a third inverter unit configured to invert a signal of the second node to output the inverted signal to the fourth node, or invert a signal of the fourth node to output the inverted signal to the second node; and
a second stage that includes:
a fourth inverter unit configured to invert the signal of the second node and output the inverted signal to the third node;
a fifth inverter unit configured to invert the signal of the fourth node and output the inverted signal to the first node; and
a sixth inverter unit configured to invert the signal of the third node to output the inverted signal to the first node, or invert the signal of the first node to output the inverted signal to the third node.

4. The frequency doubler of claim 3, wherein each of the first inverter unit and the second inverter unit comprises a pair of inverters that share the same input node and output node.

5. The frequency doubler of claim 3, wherein the third inverter unit comprises:
a first inverter configured to invert the signal of the second node and output the inverted signal to the fourth node; and
a second inverter configured to invert the signal of the fourth node and output the inverted signal to the second node.

6. The frequency doubler of claim 3, wherein the first stage and the second stage are configured substantially in the same manner, and
the first stage and the second stage are symmetrically arranged on a substrate.

7. The frequency doubler of claim 3, wherein a plurality of metal lines that are connected to the first to fourth nodes of the first stage and the second stage are formed with the same length.

8. The frequency doubler of claim 2, wherein a plurality of metal lines that connect the N nodes of the voltage controlled oscillator and the N unit blocks of the XOR circuit to each other are formed with the same length.

9. The frequency doubler of claim 1, wherein there is a phase difference of a 1/N period between the N-th signal and the (N−1)-th signal.

10. The frequency doubler of claim 1, wherein the first and second unit block sets include the first to fourth unit blocks,
the first to fourth unit blocks correspond to the first to fourth signals having different phases, respectively, and
each of the first to fourth unit blocks includes an input inverter to which any one of the first to fourth signals is input, and an output inverter which receives an output of the input inverter as its input.

11. The frequency doubler of claim 10, wherein the first unit block and the third unit block share a first intermediate node that connects the input inverter and the output inverter of the first unit block and the input inverter and the output inverter of the third unit block, and
the second unit block and the fourth unit block share a second intermediate node that is different from the first intermediate node that connects the input inverter and the output inverter of the second unit block and the input inverter and the output inverter of the fourth unit block.

12. The frequency doubler of claim 11, wherein the first signal is input to the first unit block,
the second signal that is different from the first signal is input to the second unit block,
the third signal that corresponds to an inverted signal of the second signal is input to the third unit block, and
the fourth signal that corresponds to an inverted signal of the first signal is input to the fourth unit block.

13. An XOR gate comprising:
a first input inverter including a first PMOS transistor and a first NMOS transistor;
a second input inverter including the first PMOS transistor and a second NMOS transistor that is different from the first NMOS transistor;
a third input inverter including a second PMOS transistor and a third NMOS transistor; and
a fourth input inverter including the second PMOS transistor and a fourth NMOS transistor that is different from the third NMOS transistor;
a first output inverter connected to a drain of the first PMOS transistor and including a third PMOS transistor and a fifth NMOS transistor; and
a second output inverter connected to a drain of the second PMOS transistor and including the third PMOS transistor and a sixth NMOS transistor that is different from the fifth NMOS transistor,
wherein outputs of the first and second input inverters are connected to an input of the first output inverter, and
outputs of the third and fourth input inverters are connected to an input of the second output inverter.

14. The XOR gate of claim 13, wherein a first signal having a first period is input to the first NMOS transistor,
a second signal that is different from the first signal having the first period is input to the second NMOS transistor,
the inverted second signal is input to the third NMOS transistor, and
the inverted first signal is input to the fourth NMOS transistor.

15. The XOR gate of claim 14, wherein there is a phase difference of a ¼ period between the first signal and the second signal.

16. The XOR gate of claim 14, wherein the first and second output inverters share an output node, and
the output node outputs an oscillating signal of a second period that corresponds to a half of the first period.

17. The XOR gate of claim 13, wherein enable signals that operate the first to third PMOS transistor are equally applied to gate terminals of the first to third PMOS transistors.

18. The XOR gate of claim 13, wherein a circuit of the first and second input inverters connected to the first output inverter and a circuit of the third and fourth input inverters connected to the second output inverter are arranged on a substrate substantially in the same manner.

19. A frequency doubler comprising:
a voltage controlled oscillator configured to output first to fourth signals having a first period and having different phases, the first to fourth signals being corresponding to first to fourth nodes; and
an XOR circuit configured to receive the first to fourth signals and output a signal having a second period that corresponds to a half of the first period,
wherein the voltage controlled oscillator includes:
a first stage including:
a first inverter unit configured to invert a signal of the first node and output the inverted signal to the second node;
a second inverter unit configured to invert a signal of the third node that is different from the first node and output the inverted signal to the fourth node that is different from the second node; and
a third inverter unit configured to invert a signal of the second node to output the inverted signal to the fourth node, or invert a signal of the fourth node to output the inverted signal to the second node; and
a second stage including:
a fourth inverter unit configured to invert the signal of the second node and output the inverted signal to the third node;
a fifth inverter unit configured to invert the signal of the fourth node and output the inverted signal to the first node; and
a sixth inverter unit configured to invert the signal of the third node to output the inverted signal to the first node, or invert the signal of the first node to output the inverted signal to the third node, and
the XOR circuit includes:
a first unit block set including first to fourth unit blocks that are connected to a first output node and correspond to the first to fourth nodes, respectively; and
a second unit block set including fifth to eighth unit blocks that are connected to a second output node and correspond to the first to fourth nodes, respectively,
wherein the first unit block set and the second unit block set have substantially the same circuit configurations,
wherein the first unit block set comprises:
a first input inverter including a first PMOS transistor and a first NMOS transistor;
a second input inverter including the first PMOS transistor and a second NMOS transistor;
a third input inverter including a second PMOS transistor and a third NMOS transistor; and
a fourth input inverter including the second PMOS transistor and a fourth NMOS transistor;
a first output inverter connected to a drain of the first PMOS transistor and including a third PMOS transistor and a fifth NMOS transistor; and
a second output inverter connected to a drain of the second PMOS transistor and including the third PMOS transistor and a sixth NMOS transistor that is different from the fifth NMOS transistor,
wherein outputs of the first and second input inverters are connected to an input of the first output inverter, and
outputs of the third and fourth input inverters are connected to an input of the second output inverter.

* * * * *